US008698513B2

(12) United States Patent
Sato et al.

(10) Patent No.: US 8,698,513 B2
(45) Date of Patent: Apr. 15, 2014

(54) PROBE AND METHOD OF MANUFACTURING PROBE

(71) Applicant: Fujitsu Component Limited, Tokyo (JP)

(72) Inventors: Koki Sato, Tokyo (JP); Koki Takahashi, Tokyo (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 14/053,747

(22) Filed: Oct. 15, 2013

(65) Prior Publication Data
US 2014/0033792 A1     Feb. 6, 2014

Related U.S. Application Data

(62) Division of application No. 13/084,801, filed on Apr. 12, 2011, now Pat. No. 8,587,333.

(30) Foreign Application Priority Data

Apr. 19, 2010   (JP) .................................. 2010-096111

(51) Int. Cl.
 *G01R 31/00*  (2006.01)
 *B21D 31/00*  (2006.01)

(52) U.S. Cl.
 USPC ..................................... 324/755.01; 72/379.2

(58) Field of Classification Search
 USPC ......... 324/122–129, 76.11, 520–525, 755.01, 324/755.05, 756.01–756.05, 500, 518; 72/379.2, 362, 370.01–370.2; 363/132, 363/131, 127, 16–20
 See application file for complete search history.

(56) References Cited

U.S. PATENT DOCUMENTS

| 6,668,164 | B2 * | 12/2003 | Hughes ...................... 455/234.1 |
| 7,047,638 | B2 * | 5/2006 | Eldridge et al. ................ 29/884 |
| 7,212,798 | B1 * | 5/2007 | Adams et al. .............. 455/251.1 |
| 7,433,662 | B2 * | 10/2008 | Behzad et al. .............. 455/239.1 |
| 7,755,373 | B2 * | 7/2010 | Duerig et al. ............ 324/750.06 |
| 7,832,091 | B2 | 11/2010 | Kazama et al. |
| 8,179,692 | B2 * | 5/2012 | Ihara ............................. 361/787 |
| 8,471,578 | B2 | 6/2013 | Sato et al. |

FOREIGN PATENT DOCUMENTS

| JP | 2007-024664 | 2/2007 |
| JP | 2007-071699 | 3/2007 |

* cited by examiner

*Primary Examiner* — Melissa Koval
*Assistant Examiner* — Trung Nguyen
(74) *Attorney, Agent, or Firm* — IPUSA, PLLC

(57) ABSTRACT

A probe used for electrical measurement includes first and second internal electrically-conductive parts; first and second terminal contact parts configured to contact first and second external electrode terminals, respectively; first and second spring parts each having a meandering pattern; a housing part configured to surround the first and second internal electrically-conductive parts. The first internal electrically-conductive part, the first terminal contact part, the first spring part, the housing part, the second spring part, the second terminal contact part, and the second internal electrically-conductive part are successively connected in a single metal plate from a first end to a second end thereof. The first and second terminal contact parts are in first and second bent portions, respectively, of the single metal plate. The first and second internal electrically-conductive parts are configured to contact each other at the time of performing the electrical measurement.

18 Claims, 12 Drawing Sheets

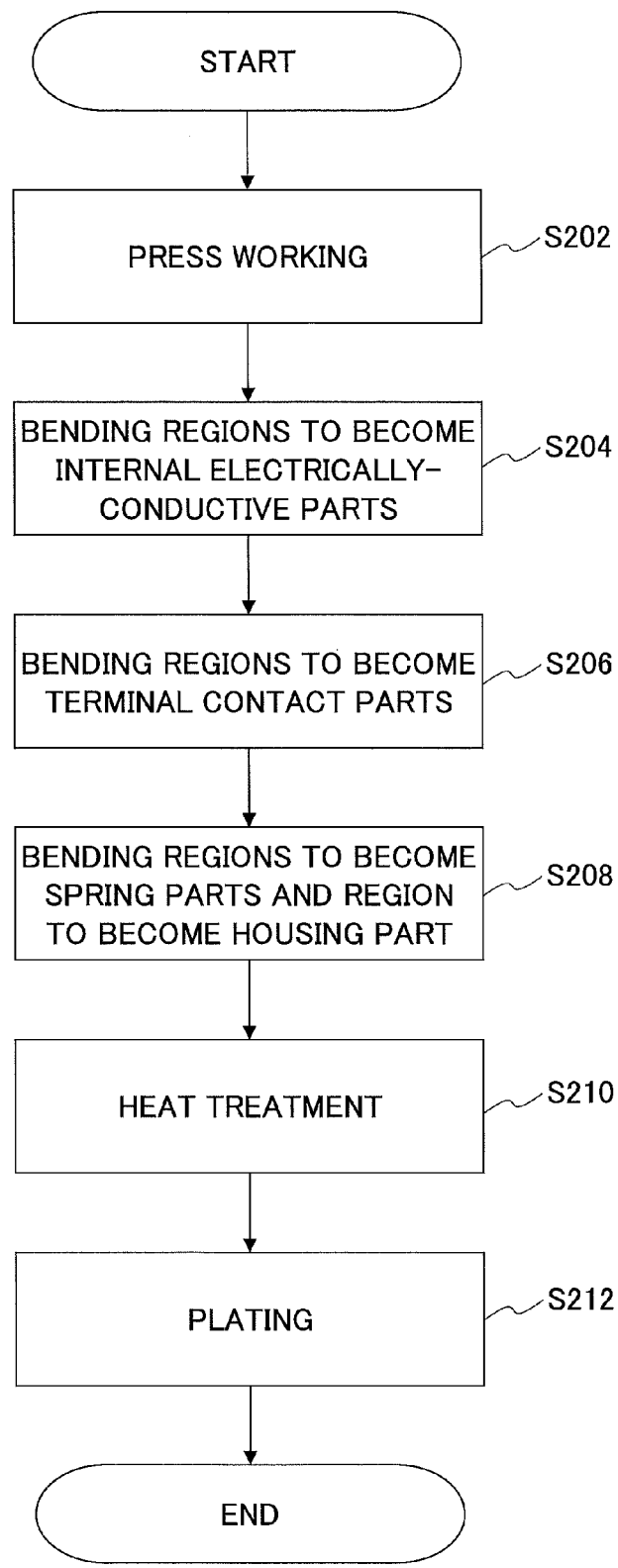

PROBE AND METHOD OF MANUFACTURING PROBE

CROSS-REFERENCE TO RELATED APPLICATIONS

The present application is a division of U.S. patent application Ser. No. 13/084,801 filed on Apr. 12, 2011, which is based upon and claims the benefit of priority of Japanese Patent Application No. 2010-096111, filed on Apr. 19, 2010. The disclosures of the prior applications are hereby incorporated herein in their entirety by reference.

BACKGROUND OF THE INVENTION

1. Field of the Invention

The present invention relates a probe and a method of manufacturing the probe.

2. Description of the Related Art

In manufacturing a semiconductor integrated circuit, a measuring apparatus is used for measuring the electrical characteristics of the semiconductor integrated circuit formed on a wafer. Such a measuring apparatus is configured to perform electrical measurement by causing a probe to come into direct contact with and electrically connect to an electrode pad or an electrode terminal formed on the wafer.

In general, a probe called "coil spring probe" is used as such a probe. This probe has a coil spring housed in a cylindrical body. The coil spring has a first end serving as the contact terminal of the probe to come into contact with an electrode pad or an electrode terminal formed on the wafer, and has a second end electrically connected to the measuring apparatus. In the coil spring probe, the coil spring provided in the cylindrical body allows the contact terminal of the probe to extend and retract, thereby ensuring the electrical contact with the electrode pad or the electrode terminal.

For the related art, reference may be made to Japanese Laid-Open Patent Application No. 2007-24664 and Japanese Laid-Open Patent Application No. 2007-71699, for example.

SUMMARY OF THE INVENTION

According to an aspect of the present invention, a probe used for electrical measurement includes a first internal electrically-conductive part; a second internal electrically-conductive part; a first terminal contact part configured to contact a first external electrode terminal; a second terminal contact part configured to contact a second external electrode terminal; a first spring part having a meandering pattern; a second spring part having a meandering pattern; and a housing part configured to surround the first and second internal electrically-conductive parts, wherein the first internal electrically-conductive part, the first terminal contact part, the first spring part, the housing part, the second spring part, the second terminal contact part, and the second internal electrically-conductive part are successively connected in a single metal plate from a first end to a second end thereof, the first and second terminal contact parts are in a first bent portion and a second bent portion, respectively, of the single metal plate, and the first and second internal electrically-conductive parts are configured to contact each other at a time of performing the electrical measurement.

According to an aspect of the present invention, a probe used for electrical measurement includes a first internal electrically-conductive part; a first terminal contact part configured to contact a first external electrode terminal; a first spring part having a meandering pattern; and a first housing part configured to surround the first internal electrically-conductive part, the first internal electrically-conductive part, the first terminal contact part, the first spring part, and the first housing part being successively connected in a first metal plate from an end thereof; and a second internal electrically-conductive part; a second terminal contact part configured to contact a second external electrode terminal; a second spring part having a meandering pattern; and a second housing part configured to surround the second internal electrically-conductive part, the second internal electrically-conductive part, the second terminal contact part, the second spring part, and the second housing part being successively connected in a second metal plate from an end thereof, wherein the first terminal contact part is in a bent portion of the first metal plate, the second terminal contact part is in a bent portion of the second metal plate, and the first and second internal electrically-conductive parts are configured to contact each other at a time of performing the electrical measurement.

According to an aspect of the present invention, a method of manufacturing a probe used for electrical measurement includes processing a single metal plate into a predetermined shape; performing plating on a surface of the single metal plate processed into the predetermined shape; and bending the single metal plate subjected to the plating, wherein the single metal plate processed into the predetermined shape includes a region to become a first internal electrically-conductive part of the probe, a region to become a first terminal contact part of the probe to contact a first external electrode terminal, a meandering region to become a first spring part of the probe, a region to become a housing part of the probe, a meandering region to become a second spring part of the probe, a region to become a second terminal part of the probe to contact a second external electrode terminal, and a region to become a second internal electrically-conductive part of the probe, the regions being successively connected from a first end to a second end of the single metal plate, the housing part of the probe being to surround the first and second internal electrically-conductive parts of the probe.

According to an aspect of the present invention, a method of manufacturing a probe used for electrical measurement includes processing a first metal plate and a second metal plate into a first predetermined shape and a second predetermined shape, respectively; performing plating on a surface of the first metal plate processed into the first predetermined shape and a surface of the second metal plate processed into the second predetermined shape; and bending the first metal plate and the second metal plate subjected to the plating, wherein the first metal plate processed into the first predetermined shape includes a region to become a first internal electrically-conductive part of the probe, a region to become a first terminal contact part of the probe to contact a first external electrode terminal, a meandering region to become a first spring part of the probe, and a region to become a first housing part of the probe to surround the first internal electrically-conductive part of the probe, the regions being successively connected from an end of the first metal plate, and the second metal plate processed into the second predetermined shape includes a region to become a second internal electrically-conductive part of the probe, a region to become a second terminal contact part of the probe to contact a second external electrode terminal, a meandering region to become a second spring part of the probe, and a region to become a second housing part of the probe to surround the second internal electrically-conductive part of the probe, the regions being successively connected from an end of the second metal plate.

According to an aspect of the present invention, a method of manufacturing a probe used for electrical measurement includes processing a single metal plate into a predetermined shape, the single metal plate containing an age-hardening alloy; bending the single metal plate processed into the predetermined shape; performing heat treatment on the single metal plate after said bending; and performing plating on the single metal plate after said heat treatment, wherein the single metal plate processed into the predetermined shape includes a region to become a first internal electrically-conductive part of the probe, a region to become a first terminal contact part of the probe to contact a first external electrode terminal, a meandering region to become a first spring part of the probe, a region to become a housing part of the probe, a meandering region to become a second spring part of the probe, a region to become a second terminal part of the probe to contact a second external electrode terminal, and a region to become a second internal electrically-conductive part of the probe, the regions being successively connected from a first end to a second end of the single metal plate, the housing part of the probe being to surround the first and second internal electrically-conductive parts of the probe.

The object and advantages of the embodiments will be realized and attained by means of the elements and combinations particularly pointed out in the claims.

It is to be understood that both the foregoing general description and the following detailed description are exemplary and explanatory and not restrictive of the invention as claimed.

BRIEF DESCRIPTION OF THE DRAWINGS

Other objects, features and advantages of the present invention will become more apparent from the following detailed description when read in conjunction with the accompanying drawings, in which:

FIG. 13 is a flowchart of a method of manufacturing a probe according to a fifth embodiment of the present invention.

DETAILED DESCRIPTION OF THE PREFERRED EMBODIMENTS

Generally, the above-described coil spring probe, which includes the contact part of the probe, a coil spring, and a cylindrical body, is manufactured by manufacturing the contact part, the coil spring, and the cylindrical body as separate components and assembling these components. This complicates the manufacturing process, thus causing an increase in manufacturing cost.

According to an aspect of the present invention, a probe for electrical connection having a spring function is provided that may be manufactured at low cost in a short period of time.

A description is given below, with reference to the accompanying drawings, of embodiments of the present invention.

[a] First Embodiment

A description is given of a probe according to a first embodiment. The probe of this embodiment is used for testing electronic components, electric circuits, etc., and is configured to electrically connect to an electrode pad, an electrode terminal or the like (which may be simply referred to as "electrode terminal") formed on a semiconductor chip, an electronic component, or an electric circuit.

Figure 1:
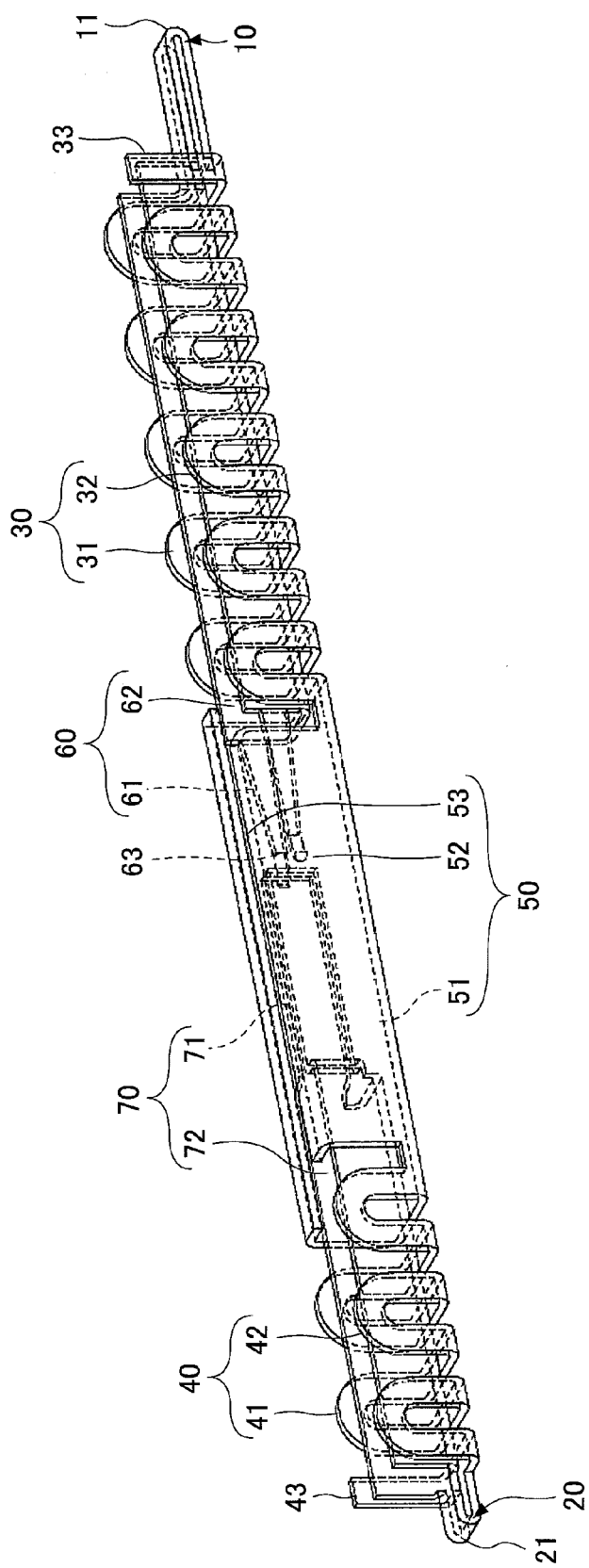
FIG. 1 is a perspective view of a probe according to a first embodiment of the present invention.
Figure 2:
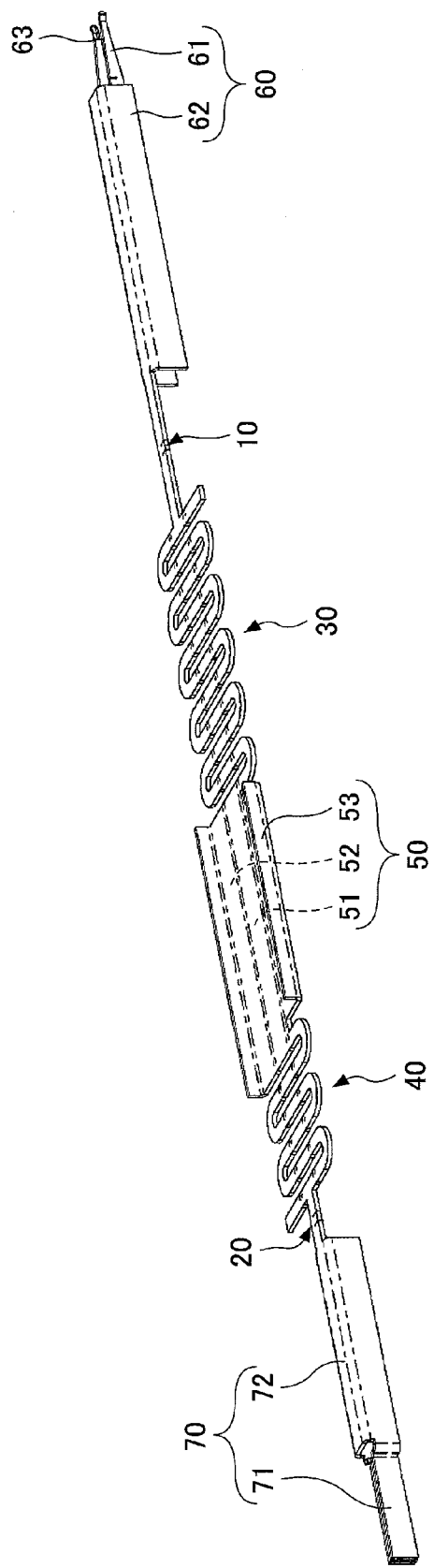
FIG. 2 is a diagram illustrating the probe according to the first embodiment of the present invention.

FIG. 1 is a diagram illustrating a structure of a probe according to this embodiment. FIG. 2 is a diagram illustrating the shape of the probe at a certain stage in the middle of its manufacture.

For example, as illustrated in FIG. 1 and FIG. 2, the probe of this embodiment may be formed by bending a single metal plate, for example, a stamped-out portion of a metal plate of copper or an alloy containing copper. Accordingly, the probe of this embodiment has a unitary structure, which is continuous throughout.

Referring to FIG. 1 and FIG. 2, according to this embodiment, the probe includes a first terminal contact part 10, a second terminal contact part 20, a first spring part 30, a second spring part 40, a housing part 50, a first internal electrically-conductive part 60, and a second internal electrically-conductive part 70.

According to this embodiment, the probe has the first terminal contact part 10 and the second terminal contact part 20 at its first end and second end, respectively. In a metal plate, regions where the first terminal contact part 10 and the second terminal contact part 20 are to be formed are formed to be elongated in shape, and the metal plate is bent 180° in these regions, thereby forming the first terminal contact part 10 and the second terminal contact part 20. One of the first terminal contact part 10 and the second terminal contact part 20 is configured to come into contact with and electrically connect to an electrode pad, an electrode terminal or the like of an electric circuit, an electronic component or the like formed on a wafer, and the other one of the first terminal contact part 10 and the second terminal contact part 20 is configured to connect to an electrode terminal in a measuring apparatus or the like.

The first terminal contact part 10 has a bent first end portion 11 formed at its end. When the first terminal contact part 10 is caused to contact an electrode terminal or the like, the first terminal contact part 10 comes into contact with the electrode terminal at the first end portion 11. Likewise, the second terminal contact part 20 has a bent second end portion 21 formed at its end. When the second terminal contact part 20 is caused to contact an electrode terminal or the like, the second terminal contact part 20 comes into contact with the electrode terminal at the second end portion 21.

The probe has the first spring part 30 formed on the side on which the first terminal contact part 10 is provided. The first spring part 30 is formed by bending a flat-plate portion of the metal plate, meandering to have U-shaped bent portions on each side, approximately 90° along a longitudinal direction on each side of a substantially center portion so that the bent flat-plate portion has an angular C-letter cross-sectional shape (taken along a plane perpendicular to the longitudinal direction). As a result, the first spring part 30 has a first side 31 and a second side 32 angled relative to the center portion to be substantially parallel to each other. Thus, the first spring part 30 has a meandering shape (meandering pattern) with U-shaped bent portions on each side. This allows the first spring part 30 to have elasticity and serve as a spring.

The probe has the second spring part 40 formed on the side on which the second terminal contact part 20 is provided. The second spring part 40 is formed by bending a flat-plate portion of the metal plate, meandering to have U-shaped bent portions on each side, approximately 90° along a longitudinal direction on each side of a substantially center portion so that the bent flat-plate portion has an angular C-letter cross-sectional shape (taken along a plane perpendicular to the longitudinal direction). As a result, the second spring part 40 has a first side 41 and a second side 42 angled relative to the center portion to be substantially parallel to each other. Thus, the second spring part 40 has a meandering shape (meandering pattern) with U-shaped bent portions on each side. This allows the second spring part 40 to have elasticity and serve as a spring.

According to this embodiment, each of the first spring part 30 and the second spring part 40 has a bent structure having an angular C-letter cross-sectional shape. Alternatively, each of the first spring part 30 and the second spring part 40 may also have a bent structure having a U-letter cross-sectional shape.

The housing part 50 is provided between the first spring part 30 and the second spring part 40. The housing part 50 is so formed as to surround the first internal electrically-conductive part 60 and the second internal electrically-conductive part 70. The housing part 50 includes a bottom surface part 51, side surface parts 52 at an angle of approximately 90° to the bottom surface part 51, and top surface parts 53 at an angle of approximately 90° to the respective side surface parts 52. As a result, the housing part 50 has a substantially quadrangular cross-sectional shape.

The surface of the bottom surface part 51 of the housing part 50 and the bottom surfaces of the first spring part 30 and the second spring part 40 are formed to be level with each other (in the same plane). The surface of one of the side surface parts 52 of the housing part 50 and the surfaces of the first sides 31 and 41 of the first and second spring parts 30 and 40 are formed to be level with each other (in the same plane). The surface of the other one of the side surface parts 52 of the housing part 50 and the surfaces of the second sides 32 and 42 of the first and second spring parts 30 and 40 are formed to be level with each other (in the same plane). Therefore, the first spring part 30 and the second spring part 40 also serve as a housing.

The first internal electrically-conductive part 60 is configured to cause the electric current detected with the first terminal contact part 10 to flow. The first internal electrically-conductive part 60 includes an internal contact part 61 configured to come into contact with the second internal electrically-conductive part 70 and an internal body part 62.

The second internal electrically-conductive part 70 is configured to electrically connect to the first internal electrically-conductive part 60, thereby allowing electric current to flow from the first terminal contact part 10 to the second terminal contact part 20. The second internal electrically-conductive part 70 includes an internal contact part 71 configured to come into contact with the first internal electrically-conductive part 60 and an internal body part 72.

The internal contact part 61 of the first internal electrically-conductive part 60 has a shape of two plates so as to hold the internal contact part 71 of the second internal electrically-conductive part 70 between the two plates (plate portions) to allow the internal contact part 71 to fit into the internal contact part 61. That is, the internal contact part 61 of the first internal electrically-conductive part 60, which is defined by two plate portions with a spring characteristic, includes bent portions 63 at its end, which are bent or curved into, for example, an angular arch shape to have their opposed surfaces projecting toward each other. The distance (interval) between these two bent portions 63 is smaller than the thickness of the internal contact part 71. This causes forces to be exerted in the two bent portions 63 in directions to push against the internal contact part 71 when the internal contact part 71 is in contact with the internal contact part 61, being held by its plate portions. This allows the internal contact part 61 of the first internal electrically-conductive part 60 and the internal contact part 71 of the second internal electrically-conductive part 70 to fit and electrically connect to each other.

That is, according to the probe of this embodiment, with no force applied, the internal contact part 61 of the first internal electrically-conductive part 60 and the internal contact part 71 of the second internal electrically-conductive part 70 are separate from each other and electrically unconnected. However, when the probe is installed in insulating body outer frames 80 and 90 (described below with reference to FIG. 3), a force is applied between a housing front part 33 (FIG. 1) provided at the end of the first spring part 30 on its first terminal contact part 10 side and a housing rear part 43 (FIG. 1) provided at the end of the second spring part 40 on its second terminal contact part 20 side. This causes the first spring part 30 and the second spring part 40 to contract (be compressed), so that the internal contact part 61 of the first internal electrically-conductive part 60 and the internal contact part 71 of the second internal electrically-conductive part 70 come into contact with and electrically connect to each other.

As a result of the internal contact part 61 and the internal contact part 71 thus contacting and electrically connecting to each other, electric current flows from the first terminal contact part 10 to the internal body part 62 and the internal contact part 61 of the first internal electrically-conductive part 60 to the internal contact part 71 and the internal body part 72 of the second internal electrically-conductive part 70 to the second terminal contact part 20 in this order. In the case of causing electric current to flow from the second terminal contact part 20 to the first terminal contact part 10, the electric current flows in the reverse order. The probe of this embodiment has a single contact point, at which the internal contact part 61 of the first internal electrically-conductive part 61 and the internal contact part 71 of the second internal electrically-conductive part 70 come into contact. This makes it possible to cause electric current to flow with low resistance and thus to transmit a signal with low resistance.

Further, according to this embodiment, the first spring part 30 and the second spring part 40 are formed outside the first internal electrically-conductive part 60 and the second internal electrically-conductive part 70, respectively. This allows the first spring part 30 and the second spring part 40 to be large in shape. Accordingly, the first spring part 30 and the second spring part 40 are allowed to have a strong spring characteristic, thus making it possible to further ensure the contact between the first terminal contact part 10 and an electrode terminal and the contact between the second terminal contact part 20 and an electrode terminal.

Further, according to this embodiment, the first spring part 30 and the second spring part 40 form part of the housing part 50. Accordingly, compared with the case of forming a housing outside the entire probe, the probe of this embodiment may be manufactured with a reduced amount of plate metal. This makes it possible for the probe to be reduced in weight and further in cost as well.

Figure 3:
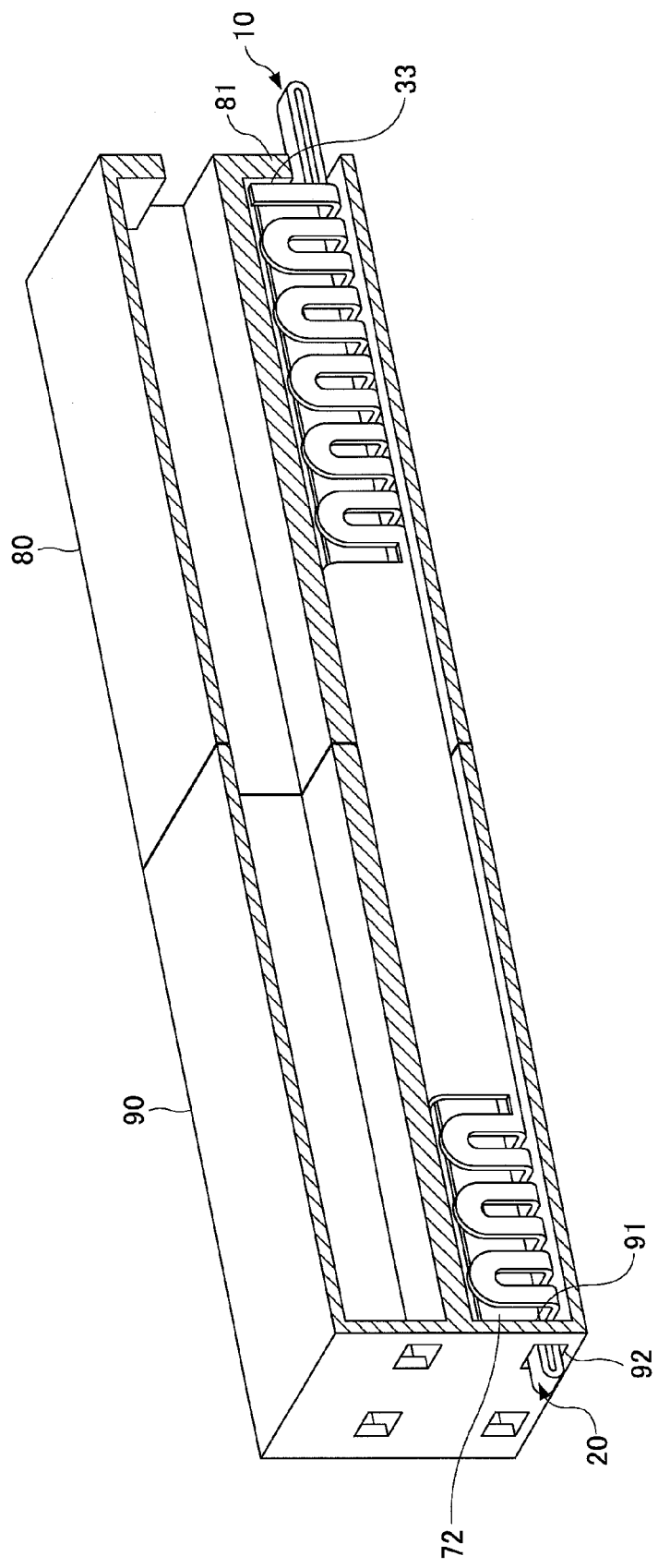
FIG. 3 is a diagram illustrating a state of use of the probe according to the first embodiment of the present invention.

Next, a description is given, with reference to FIG. 3, of a method of using a probe according to this embodiment.

According to this embodiment, probes may be arranged two-dimensionally at substantially equal intervals in the insulating body outer frames 80 and 90. According to this embodiment, the probe includes two spring parts: the first spring part 30 and the second spring part 40. Accordingly, in the case of installing multiple probes of this embodiment two-dimensionally in the insulating body outer frames 80 and 90, the housing front part 33 of the probe comes into contact with a holding part 81 of the insulating body outer frame 80, and the housing rear part 43 (FIG. 1) of the probe comes into contact with a holding part 91 of the insulating body outer frame 90, so that by joining the insulating body outer frame 80 and the insulating body outer frame 90, forces are applied via the holding part 81 and the holding part 91 in directions to compress the housing front part 33 and the housing front part 43, that is, in directions to cause the first spring part 30 and the second spring part 40 to contract in the probe. Since the first spring part 30 and the second spring part 40 each have a spring characteristic, these forces fix the probe of this embodiment to the insulating body outer frames 80 and 90. At the same time, the first spring part 30 and the second spring part 40 of the probe contract (are compressed) as described above. As a result, the internal contact part 61 of the first internal electrically-conductive part 60 and the internal contact part 71 of the second internal electrically-conductive part 70 come into contact, so that the first terminal contact part 10 and the second terminal contact part 20 are electrically connected. As a result, it is possible to perform electrical measurement by causing the first terminal contact part 10 and the second terminal contact part 20, both projecting outward from the insulating body outer frames 80 and 90, to come into contact with corresponding electrode terminals.

Figure 4:
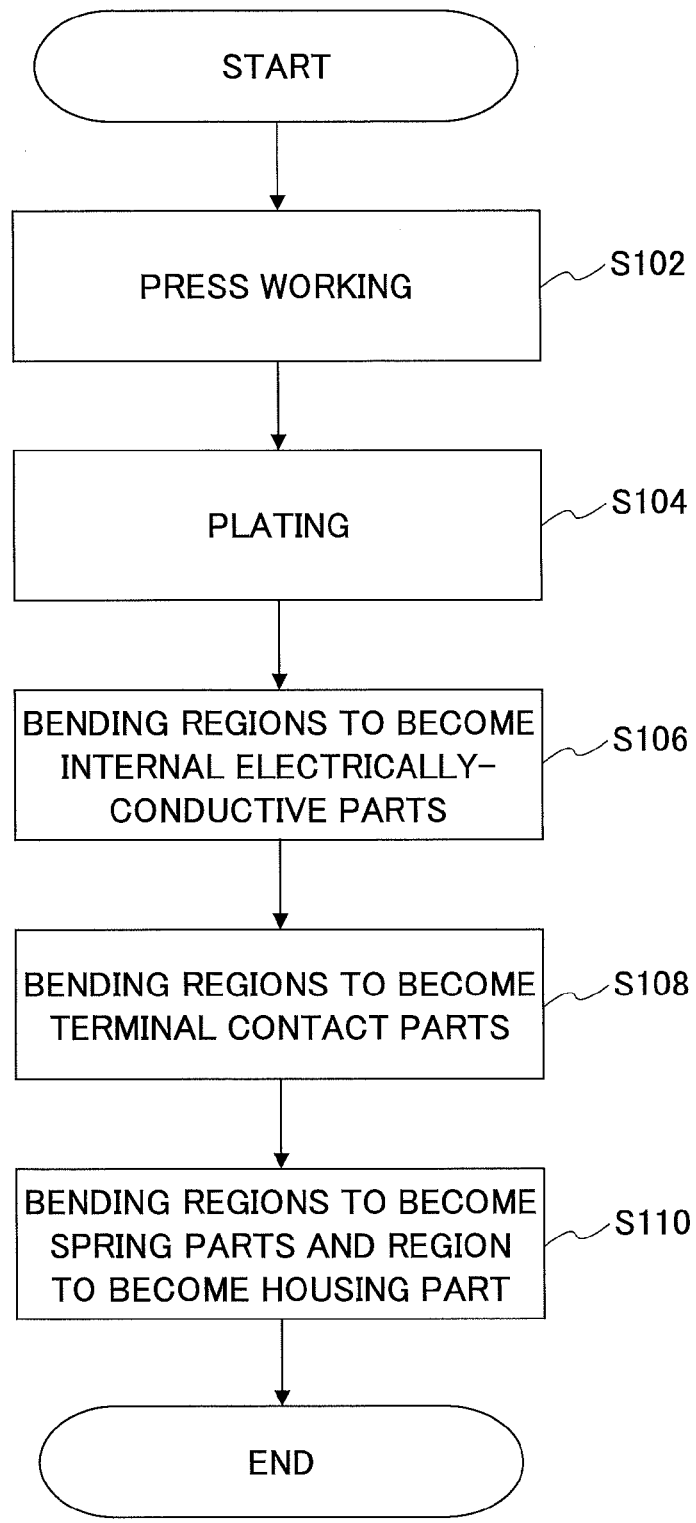
FIG. 4 is a flowchart of a method of manufacturing a probe according to the first embodiment of the present invention.

Next, a description is given, with reference to FIG. 4, of a method of manufacturing a probe according to this embodiment.

First, in step S102 of FIG. 4, a metal plate is formed (processed) into a predetermined shape to manufacture a probe according to this embodiment (a metal plate forming process). The forming method may be to stamp out a metal plate by press working or to form a mask of a predetermined shape on a metal plate and etch off a region of the metal plate where the mask is not formed. The metal plate may be formed of copper or an alloy containing copper and be 30 μm to 150 μm in thickness. According to this embodiment, a metal plate of a predetermined shape is formed by press working using a copper-alloy plate of 60 μm in thickness.

The metal plate of a predetermined shape formed in this process, which is a single flat metal plate, includes a region to become the first internal electrically-conductive part 60, a region to become the first terminal contact part 10, a region to become the first spring part 30, a region to become the housing part 50, a region to become the second spring part 40, a region to become the second terminal contact part 20, and a region to become the second internal electrically-conductive part 70, which are formed from one end to the other end of the metal plate in this order.

Next, in step S104, the metal plate formed into a predetermined shape is subjected to plating (a plating process). This plating is performed by performing Ni plating, Pd plating, and Au plating in sequence or performing Ni plating and Au plating in sequence.

Next, in step S106, the region to become the first internal electrically-conductive part 60 and the region to become the second internal electrically-conductive part 70 are bent (a first bending process). For example, in the region to become the first internal electrically-conductive part 60, a region to become the internal body part 62 is bent approximately 90° on each longitudinal side, thereby forming the internal body part 62 having an angular C-letter cross-sectional shape. The internal contact part 61 is formed by bending portions to become the internal contact part 61 at points near their respective ends into, for example, an angular arch shape, so that the gap (distance) between the two bent portions 63 is narrow (small).

Further, in the region to become the second internal electrically-conductive part 70, a region to become the internal body part 72 is bent approximately 90° on each longitudinal side, thereby forming the internal body part 72 having an angular C-letter cross-sectional shape. The internal contact part 71 is formed to be thinner than the internal body part 72 by bending extensions of the side portions of the internal body part 72 so that the rear (inside) surfaces of the extensions come close to each other. The interval (distance) between the two bent portions 63 in the first internal electrically-conductive part 60 is smaller than the dimension of the metal plate in its thickness directions in the internal contact part 71 of the second internal electrically-conductive part 70. At this point, in the region to become the housing part 50, portions to become the top surface parts 53 are also bent approximately 90° relative to portions to become the side surface parts 52 on both longitudinal sides. FIG. 2 illustrates the metal plate bent in this process.

Next, in step S108, the region to become the first terminal contact part 10 and the region to become the second terminal contact part 20 are bent (a second bending process). For example, the region to become the first terminal contact part 10 is bent 180° in a direction opposite to the bending direction in the first internal electrically-conductive part 60 (that is, toward the region to become the second terminal contact part 20), thereby forming the first terminal contact part 10. The portion bent 180° becomes the first end portion 11 to come into contact with an electrode terminal. Likewise, the region to become the second terminal contact part 20 is bent 180° in a direction opposite to the bending direction in the second internal electrically-conductive part 70 (that is, toward the region to become the first terminal contact part 10), thereby forming the second terminal contact part 20. The portion bent 180° becomes the second end portion 21 to come into contact with an electrode terminal.

Next, in step S110, the region to become the housing part 50, the region to become the first spring part 30, and the region to become the second spring part 40 are bent (a third bending process). For example, the region to become the housing part 50, the region to become the first spring part 30, and the region to become the second spring part 40 are bent approximately 90° on each longitudinal side so as to cover the side surfaces of the first internal electrically-conductive part 60 and the second internal electrically-conductive part 70. As a result of such bending, the side surface parts 52 of the housing part 50, the first side 31 and the second side 32 of the first spring part 30, and the first side 41 and the second side 42 of the second spring part 40 are formed. In the region to become the housing part 50, a portion that is not bent becomes the bottom surface part 51. As a result, the housing part 50 has a substantially square cross-sectional shape.

Thus, the probe according to this embodiment may be manufactured by processing a single metal plate. Accordingly, in manufacturing a probe with a spring function, there is no need to assemble multiple components so that an assembling process may be omitted. Further, since the manufacture of the probe may include only a processing process such as press working of a metal plate, a plating process, and a bending process, the probe may be manufactured with a simple manufacturing apparatus. Further, since the manufacturing process is simple, probes may be manufactured on a massive scale in a short period of time at low cost. This allows a probe with a spring function to be manufactured at extremely low cost.

[b] Second Embodiment

Next, a description is given of a probe according to a second embodiment. The probe according to this embodiment has a first internal electrically-conductive part and a second internal electrically-conductive part different in structure from the first internal electrically-conductive part 60 and the second internal electrically-conductive part 70 of the probe of the first embodiment.

Figure 5:
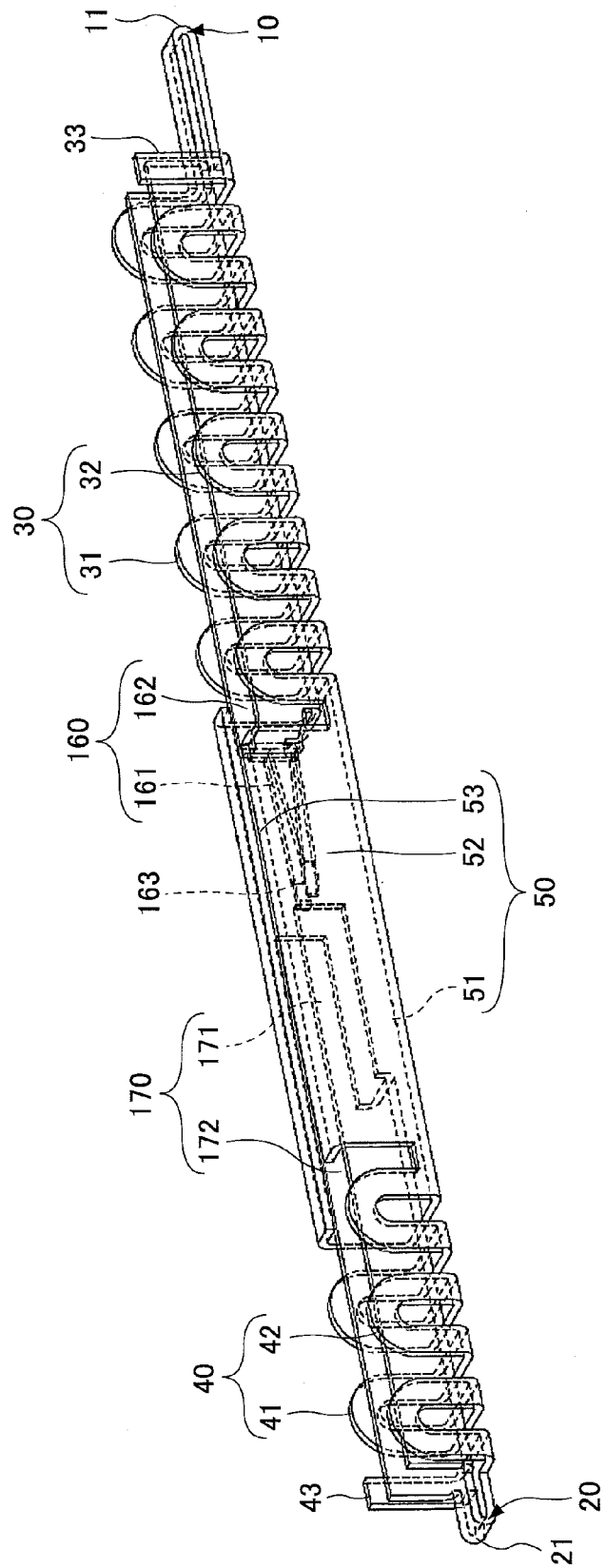
FIG. 5 is a perspective view of a probe according to a second embodiment of the present invention.
Figure 6:
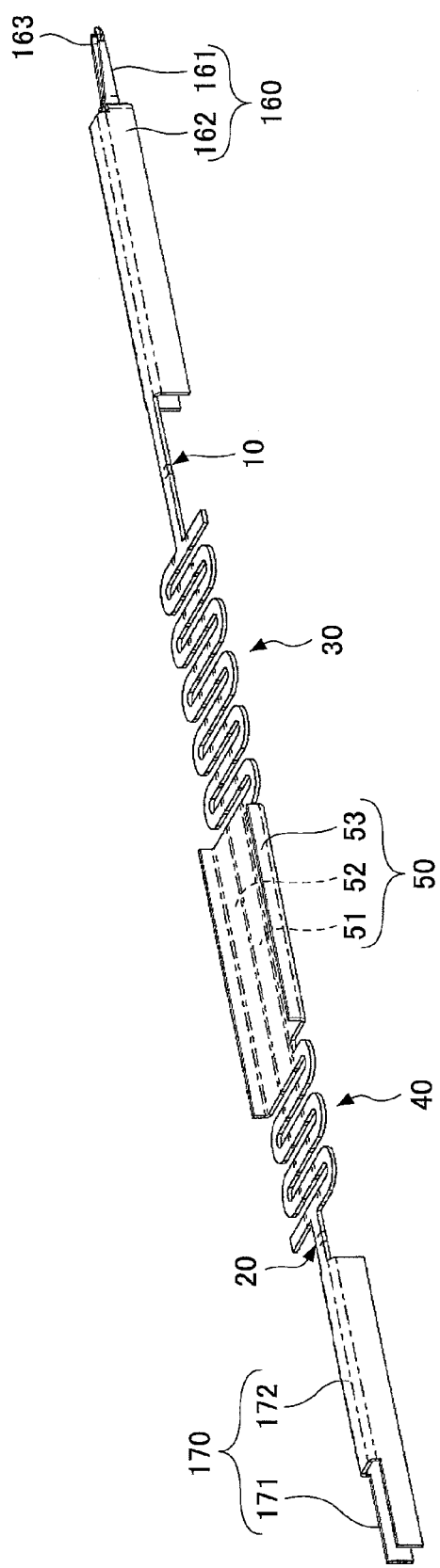
FIG. 6 is a diagram illustrating the probe according to the second embodiment of the present invention.

A description is given, with reference to FIG. 5 and FIG. 6, of the probe of this embodiment. FIG. 5 is a diagram illustrating a structure of the probe according to this embodiment. FIG. 6 is a diagram illustrating the shape of the probe at a certain stage in the middle of its manufacture. In the following description, the same elements as those described above in the first embodiment are referred to by the same reference numerals, and a description thereof is omitted.

Referring to FIG. 5 and FIG. 6, according to this embodiment, the probe includes the first terminal contact part 10, the second terminal contact part 20, the first spring part 30, the second spring part 40, the housing part 50, a first internal electrically-conductive part 160, and a second internal electrically-conductive part 170.

The first internal electrically-conductive part 160 is configured to cause the electric current detected with the first terminal contact part 10 to flow. The first internal electrically-conductive part 160 includes an internal contact part 161 configured to come into contact with the second internal electrically-conductive part 170 and an internal body part 162.

The second internal electrically-conductive part 170 is configured to electrically connect to the first internal electrically-conductive part 160, thereby allowing electric current to flow from the first terminal contact part 10 to the second terminal contact part 20. The second internal electrically-conductive part 170 includes an internal contact part 171 configured to come into contact with the first internal electrically-conductive part 160 and an internal body part 172.

The internal contact part 161 of the first internal electrically-conductive part 160 has a shape of two plates. The internal contact part 171 of the second internal electrically-conductive part 170 also has a shape of two plates, which may be parallel to each other. The internal contact part 161 is so formed as to be held inside by and fit into the internal contact part 171 (that is, held between and fit to its two parallel plate portions). That is, the internal contact part 161 of the first internal electrically-conductive part 160, which is defined by two plate portions with a spring characteristic, includes bent portions 163 at its end, which are bent or curved into, for example, an angular arch shape to have their respective outside surfaces (surfaces facing away from each other, that is, opposite to their opposed surfaces) projecting away from each other. The distance (interval) between these two bent portions 163 where the bent portions 163 are bent is greater than the inside width of the internal contact part 171 (the distance between its two plate portions). This causes forces to be exerted in the two bent portions 163 in directions to push against (the inside of) the internal contact part 171 when the internal contact part 161 is in contact with the internal contact part 171, being held by its plate portions. This ensures the electrical connection between the internal contact part 161 of the first internal electrically-conductive part 160 and the internal contact part 171 of the second internal electrically-conductive part 170.

Otherwise, the probe of the second embodiment has the same configuration as the probe of the first embodiment.

[c] Third Embodiment

Next, a description is given of a probe according to a third embodiment. The probe of this embodiment has a first terminal contact part and a second terminal contact part different in structure from the first terminal contact part 10 and the second terminal contact part 20 of the probe of the first embodiment.

Figure 7:
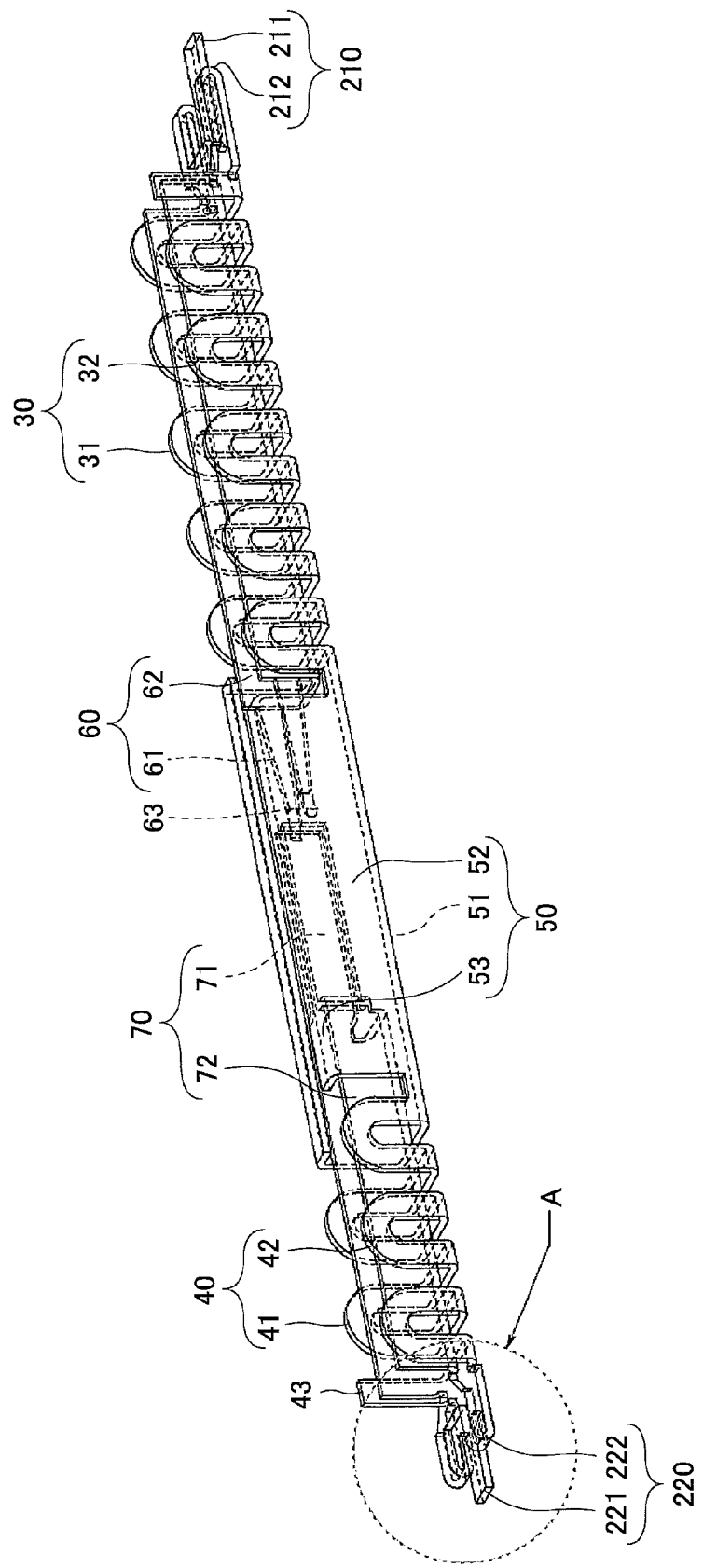
FIG. 7 is a perspective view of a probe according to a third embodiment of the present invention.
Figure 8:
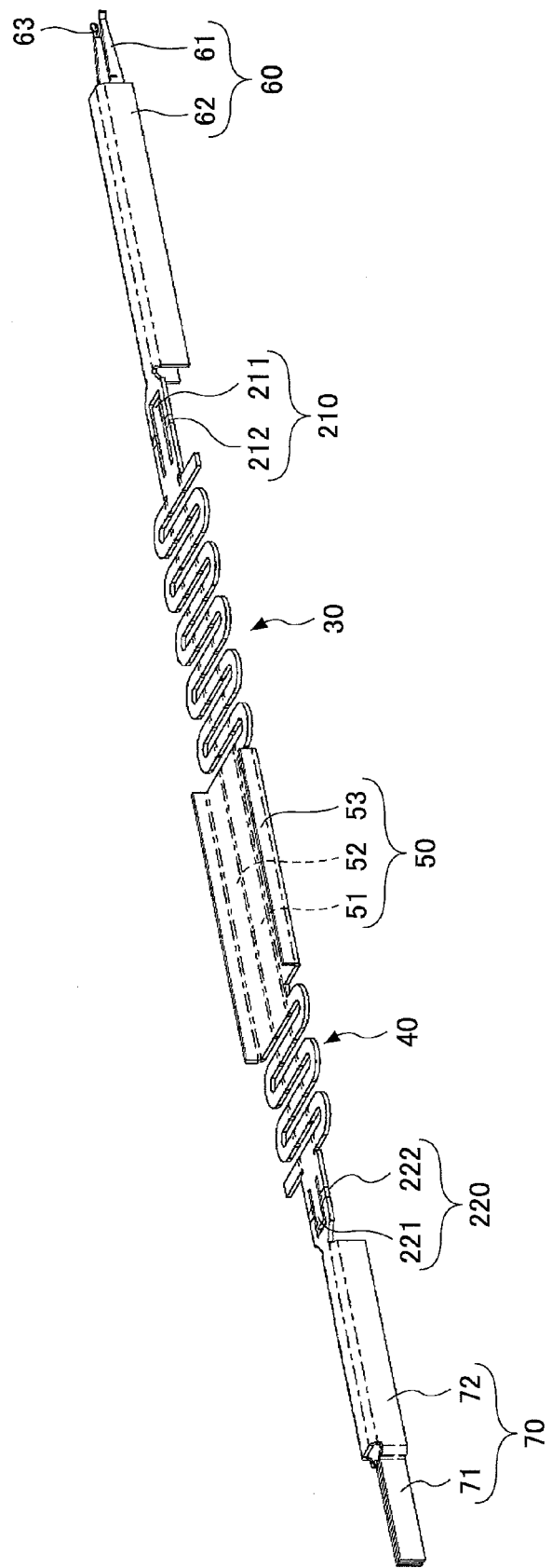
FIG. 8 is a diagram illustrating the probe according to the third embodiment of the present invention.
Figure 9:
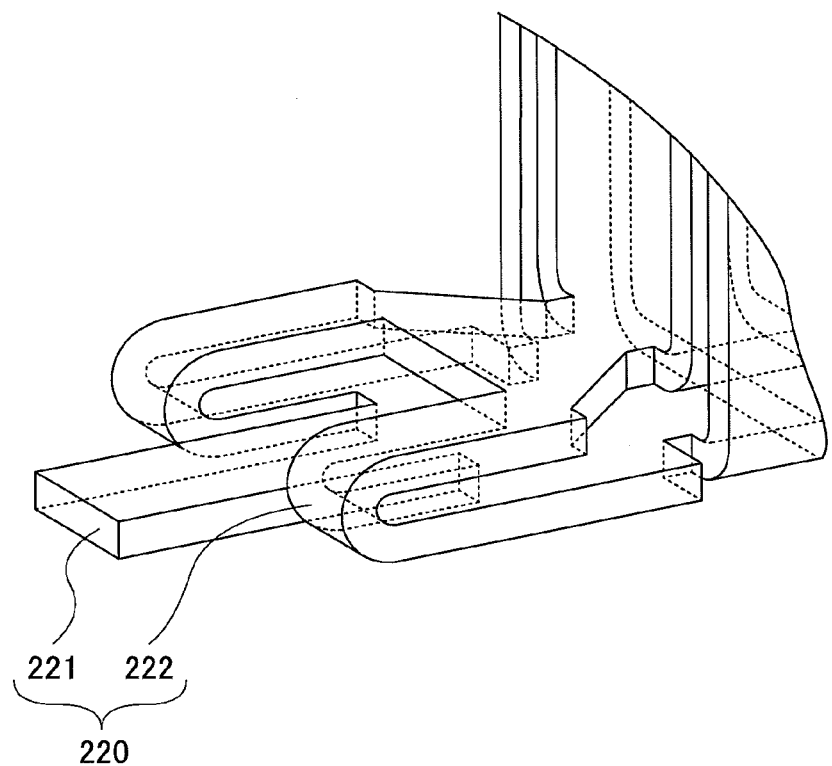
FIG. 9 is an enlarged view of part of the probe according to the third embodiment of the present invention.

A description is given, with reference to FIG. 7 through FIG. 9, of the probe of this embodiment. FIG. 7 is a diagram illustrating a structure of the probe according to this embodiment. FIG. 8 is a diagram illustrating the shape of the probe at a certain stage in the middle of its manufacture. FIG. 9 is an enlarged view of region A indicated by a broken circle in FIG. 7. In the following description, the same elements as those described above in the first embodiment are referred to by the same reference numerals, and a description thereof is omitted.

Referring to FIG. 7 through FIG. 9, according to this embodiment, the probe includes a first terminal contact part 210, a second terminal contact part 220, the first spring part 30, the second spring part 40, the housing part 50, the first internal electrically-conductive part 60, and the second internal electrically-conductive part 70.

The first terminal contact part 210 and the second terminal contact part 220 are provided one at each end of the probe of this embodiment. The first terminal contact part 210 includes a first end portion 211 and a bent portion 212. The second terminal contact part 220 includes a first end portion 221 and a bent portion 222.

The first end portion 211 is configured to come into contact with an electrode terminal when the first terminal contact part 210 is caused to contact the electrode terminal. The first end portion 211 may be exposed (caused to project) by bending a region to become the bent portion 212 180° in a region to become the first terminal contact part 210 in a metal plate (to be processed into the probe). Further, the second end portion 221 is configured to come into contact with an electrode terminal when the second terminal contact part 220 is caused to contact the electrode terminal. The second end portion 221 may be exposed (caused to project) by bending a region to become the bent portion 222 180° in a region to become the second terminal contact part 220 in the metal plate.

Figure 10:
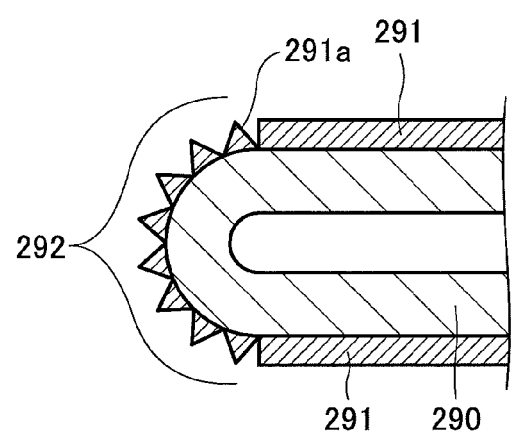
FIG. 10 is a diagram illustrating a case where a bending process is performed after a plating process.

The probe of this embodiment includes the first end portion 211 and the second end portion 221, which are not bent. As illustrated in FIG. 10, when a metal plate 290 is bent in the bending process after the plating process, cracks are caused to generate inequalities in a plating part 291 formed on the surface of the metal plate 290 in a bent region 292. Accordingly, a reliable electrical connection with an electrode terminal may not be ensured in a cracked portion 291*a* of the plating part 291. Therefore, the first and second end portions 211 and 221 to come into contact with electrode terminals are formed without bending.

Otherwise, the probe of the third embodiment has the same configuration as the probe of the first embodiment. This embodiment may also be applied to the probe of the second embodiment.

[d] Fourth Embodiment

Next, a description is given of a probe according to the fourth embodiment. The probe according to this embodiment, which has a structure corresponding to the probe of the first embodiment cut at the housing part 50, is composed of two members.

Figure 11:
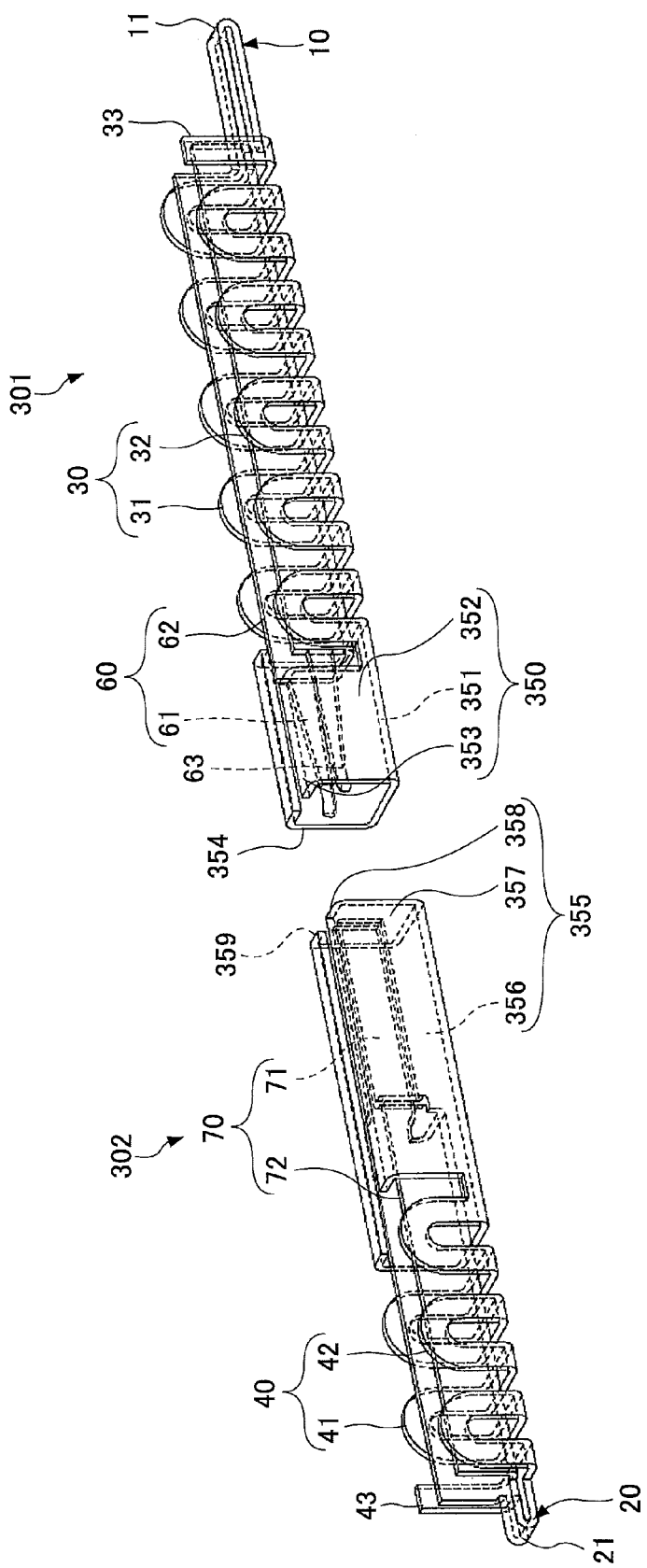
FIG. 11 is a perspective view of a probe according to a fourth embodiment of the present invention.
Figure 12:
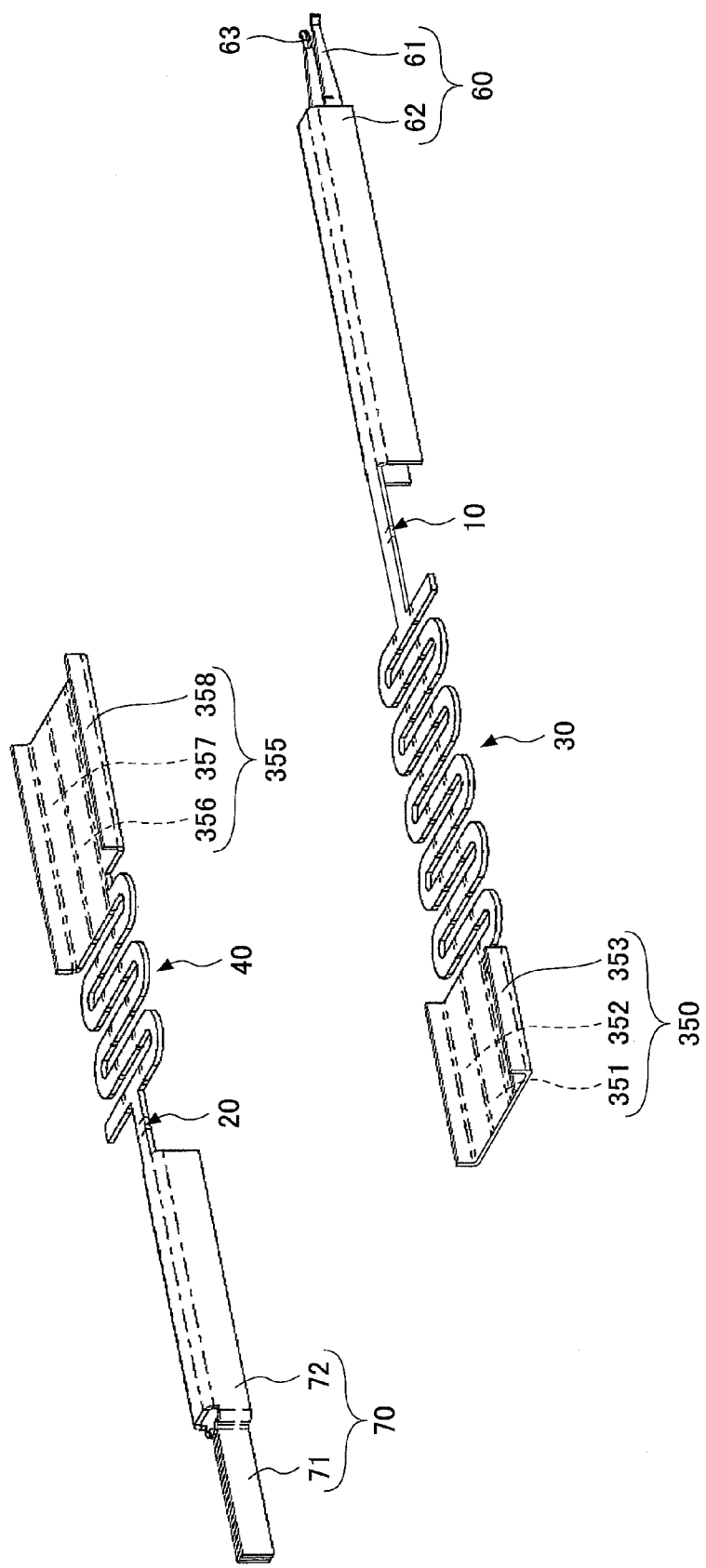
FIG. 12 is a diagram illustrating the probe according to the fourth embodiment of the present invention.

A description is given, with reference to FIG. 11 and FIG. 12, of the probe of this embodiment. FIG. 11 is a diagram illustrating a structure of the probe according to this embodiment. FIG. 12 is a diagram illustrating the shape of the probe at a certain stage in the middle of its manufacture. In the following description, the same elements as those described above in the first embodiment are referred to by the same reference numerals, and a description thereof is omitted.

According to this embodiment, the probe includes a first structure part 301 and a second structure part 302. The first structure part 301 includes the first terminal contact part 10, the first spring part 30, a first housing part 350, and the first internal electrically-conductive part 60. The second structure part 302 includes the second terminal contact part 20, the second spring part 40, a second housing part 355, and the second internal electrically-conductive part 70.

The first housing part 350 is formed by forming a bottom surface part 351, side surface parts 352, and top surface parts 353 by bending a region to become the first housing part 350 of a metal plate formed into a predetermined shape. The second housing part 355 is formed by forming a bottom surface part 356, side surface parts 357, and top surface parts 358 by bending a region to become the second housing part 355 of the metal plate formed into a predetermined shape.

To use the probe of this embodiment, the probe is provided in such insulating body outer frames as illustrated in FIG. 4 with the first structure part 301 and the second structure part 302 being in contact at a contact surface 354 of the first housing part 350 and a contact surface 359 of the second housing part 355. With the probe being provided in insulating body outer frames, the internal contact part 61 of the first internal electrically-conductive part 60 and the internal contact part 71 of the second internal electrically-conductive part 70 are in contact and electrically connected as in the first embodiment.

Otherwise, the probe of the fourth embodiment has the same configuration as the probe of the first embodiment. This embodiment may also be applied to the probes of the second embodiment and the third embodiment.

[e] Fifth Embodiment

Next, a description is given of a fifth embodiment. In this embodiment, a method of manufacturing a probe is illustrated that is different from the method of manufacturing a probe according to the first embodiment.

The probe manufactured in this embodiment is formed of an age-hardening alloy. For example, the probe of this embodiment is formed by processing a metal plate of an age-hardening alloy.

The age-hardening alloy may be hardened by performing heat treatment. As a result, it is possible to obtain a probe of high strength. Further, the age-hardening alloy has a disposition to be fixed in shape in response to application of heat. That is, the age-hardening alloy has a disposition to have its shape fixed to that in a heated state while maintaining a spring characteristic in response to application of heat. In this embodiment, a description is given of the case of using beryllium copper or an alloy containing beryllium copper as an age-hardening alloy. According to this embodiment, however, any material other than beryllium copper may be used as long as the material is an age-hardening alloy.

Next, a description is given of a method of manufacturing a probe according to this embodiment.

First, in step S202 of FIG. 13, a metal plate is formed (processed) into a predetermined shape to manufacture a probe according to this embodiment (a metal plate forming process). The forming method may be to stamp out a metal plate by press working, for example. The metal plate, which is formed of an age-hardening alloy as described above, is 30 μl to 150 μm in thickness. According to this embodiment, a metal plate of a predetermined shape is formed by press working using a 60 μm thick metal plate formed of beryllium copper, which is an age-hardening alloy.

Next, in step S204, of the metal plate, a region to become the first internal electrically-conductive part 60 and a region to become the second internal electrically-conductive part 70 are bent (a first bending process). For example, the same process as step S106 in the first embodiment may be performed.

Next, in step S206, of the metal plate, a region to become the first terminal contact part 10 and a region to become the second terminal contact part 20 are bent (a second bending process). For example, the same process as step S108 in the first embodiment may be performed.

Next, in step S208, of the metal plate, a region to become the housing part 50, a region to become the first spring part 30, and a region to become the second spring part 40 are bent (a third bending process). For example, the same process as step S110 in the first embodiment may be performed.

Next, in step S210, heat treatment is performed (a heat treatment process). For example, heat treatment is performed at a temperature of 270° C. for approximately 2 hours. The probe of this embodiment is formed of beryllium copper, which is an age-hardening alloy. It is possible to harden beryllium copper, which is an age-hardening alloy, by performing heat treatment. As a result, it is possible to obtain a probe of high strength. According to this embodiment, heat treatment is performed after the bending process (first through third bending processes). This is because a metal plate formed of beryllium copper is soft and easily processible before heat treatment but is hardened and difficult to process after heat treatment. Further, heat treatment is performed at an optimum temperature and for an optimum period of time based on the kind and composition of the age-hardening alloy. The temperature of heat treatment is preferably 250° C. to 400° C., and more preferably, 250° C. to 315° C. Further, the time of heat treatment is preferably 1 hour to 5 hours, and more preferably, 1 hour to 3 hours.

Next, in step S212, the metal plate is subjected to plating (a plating process). This plating is performed by performing Ni plating, Pd plating, and Au plating in sequence or performing Ni plating and Au plating in sequence.

A metal plate formed of beryllium copper has a disposition to be fixed in shape in response to application of heat. That is, beryllium copper has a disposition to have its shape fixed to that in a heated state while maintaining a spring characteristic in response to application of heat.

For example, if heat treatment is performed with the internal contact part 61 of the first internal electrically-conductive part 60 and the internal contact part 71 of the second internal electrically-conductive part 70 being in contact, the shape is fixed as it is in that state, thus preventing the internal contact parts 61 and 71 from coming into contact with each other using a spring characteristic. Further, if plating is performed with the internal contact part 61 of the first internal electrically-conductive part 60 and the internal contact part 71 of the second internal electrically-conductive part 70 being in contact, the internal contact part 61 and the internal contact part 71 are joined with plating to be immovable.

According to this embodiment, however, the internal contact part 61 of the first internal electrically-conductive part 60 and the internal contact part 71 of the second internal electrically-conductive part 70 are not in contact at the time of the heat treatment process and the plating process. Therefore, the heat treatment process and the plating process may be performed after performing the first through third bending processes.

Thus, according to this embodiment, a probe may be manufactured by processing a single metal plate formed of beryllium copper. Accordingly, in manufacturing a probe with a spring function, there is no need to assemble multiple components so that an assembling process may be omitted. Further, since the manufacture of the probe may include only a processing process such as press working of a metal plate, a plating process, a bending process, and a heat treatment process, the probe may be manufactured with a simple manufacturing apparatus. Further, since the manufacturing process is simple, probes may be manufactured on a massive scale in a short period of time at low cost. This makes it possible to manufacture a probe having a spring function at each end and low in contact resistance in the probe at extremely low cost.

Otherwise, the fifth embodiment is the same as the first embodiment. Further, this embodiment may also be applied to the probes of the second through fourth embodiments.

Further, in the first through fifth embodiments, a description is given of the case where the housing part has a substantially square cross-sectional shape. However, the housing part may be bent roundedly to have a substantially circular, substantially elliptic, or polygonal, for example, substantially triangular, cross-sectional shape.

According to an aspect of the present invention, a probe may be manufactured by processing one or two metal plates. Therefore, a probe for electrical connection having a spring function is provided that is manufactured in a short period of time at low cost without requiring an assembling process, etc.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that various changes, substitutions, and alterations could be made hereto without departing from the spirit and scope of the invention.

What is claimed is:

1. A method of manufacturing a probe used for electrical measurement, the method comprising:
    processing a single metal plate into a predetermined shape;
    performing plating on a surface of the single metal plate processed into the predetermined shape; and
    bending the single metal plate subjected to the plating,
    wherein the single metal plate processed into the predetermined shape includes a region to become a first internal electrically-conductive part of the probe, a region to become a first terminal contact part of the probe to contact a first external electrode terminal, a meandering region to become a first spring part of the probe, a region to become a housing part of the probe, a meandering region to become a second spring part of the probe, a region to become a second terminal part of the probe to contact a second external electrode terminal, and a region to become a second internal electrically-conductive part of the probe, the regions being successively connected from a first end to a second end of the single metal plate, the housing part of the probe being to surround the first and second internal electrically-conductive parts of the probe.

2. The method as claimed in claim 1, wherein:
    said bending includes
        first bending;
        second bending performed after said first bending; and
        third bending performed after said second bending,
    said first bending bends the region to become the first internal electrically-conductive part and the region to become the second internal electrically-conductive part,
    said second bending bends the region to become the first terminal contact part and the region to become the second terminal contact part substantially 180°, and
    said third bending bends the region to become the first spring part and the region to become the second spring part.

3. The method as claimed in claim 1, wherein:
    the first internal electrically-conductive part and the second internal electrically-conductive part of the probe are out of contact after said bending before installation of the probe in an insulating body outer frame, and
    the first internal electrically-conductive part and the second internal electrically-conductive part of the probe are in contact with the probe being installed in the insulating body outer frame.

4. The method as claimed in claim 1, wherein said bending bends the region to become the housing part of the probe so that the housing part of the probe has a substantially square cross-sectional shape.

5. The method as claimed in claim 1, wherein the single metal plate has a thickness of 30 µm to 150 µm.

6. The method as claimed in claim 1, wherein said processing processes the single metal plate into the predetermined shape by performing press working on the single metal plate or etching off a region of the single metal plate other than a region of the single metal plate to have the predetermined shape.

7. A method of manufacturing a probe used for electrical measurement, the method comprising:
    processing a first metal plate and a second metal plate into a first predetermined shape and a second predetermined shape, respectively;
    performing plating on a surface of the first metal plate processed into the first predetermined shape and a surface of the second metal plate processed into the second predetermined shape; and
    bending the first metal plate and the second metal plate subjected to the plating,
    wherein the first metal plate processed into the first predetermined shape includes a region to become a first internal electrically-conductive part of the probe, a region to become a first terminal contact part of the probe to contact a first external electrode terminal, a meandering region to become a first spring part of the probe, and a region to become a first housing part of the probe to surround the first internal electrically-conductive part of the probe, the regions being successively connected from an end of the first metal plate, and the second metal plate processed into the second predetermined shape includes a region to become a second internal electrically-conductive part of the probe, a region to become a second terminal contact part of the probe to contact a second external electrode terminal, a meandering region to become a second spring part of the probe, and a region to become a second housing part of the probe to surround the second internal electrically-conductive part of the probe, the regions being successively connected from an end of the second metal plate.

8. The method as claimed in claim 7, wherein:
said bending includes
  first bending;
  second bending performed after said first bending; and
  third bending performed after said second bending,
said first bending bends at least one of the region to become the first internal electrically-conductive part and the region to become the second internal electrically-conductive part,
said second bending bends at least one of the region to become the first terminal contact part and the region to become the second terminal contact part substantially 180°, and
said third bending bends at least one of the region to become the first spring part and the region to become the second spring part.

9. The method as claimed in claim 7, wherein:
the first internal electrically-conductive part and the second internal electrically-conductive part of the probe are out of contact after said bending before installation of the probe in an insulating body outer frame, and
the first internal electrically-conductive part and the second internal electrically-conductive part of the probe are in contact with the probe being installed in the insulating body outer frame.

10. The method as claimed in claim 7, wherein said bending bends the region to become the first housing part of the probe and the region to become the second housing part of the probe so that the first and second housing parts of the probe have a substantially square cross-sectional shape.

11. The method as claimed in claim 7, wherein the first and second metal plates have a thickness of 30 µm to 150 µm.

12. The method as claimed in claim 7, wherein said processing processes the first and second metal plates into the first and second predetermined shapes, respectively, by performing press working on at least one of the first and second metal plates or etching off a region of at least one of the first and second metal plates other than a region of the at least one of the first and second metal plates to have the first or second predetermined shape.

13. A method of manufacturing a probe used for electrical measurement, the method comprising:
processing a single metal plate into a predetermined shape, the single metal plate containing an age-hardening alloy;
bending the single metal plate processed into the predetermined shape;
performing heat treatment on the single metal plate after said bending; and
performing plating on the single metal plate after said heat treatment,
wherein the single metal plate processed into the predetermined shape includes a region to become a first internal electrically-conductive part of the probe, a region to become a first terminal contact part of the probe to contact a first external electrode terminal, a meandering region to become a first spring part of the probe, a region to become a housing part of the probe, a meandering region to become a second spring part of the probe, a region to become a second terminal part of the probe to contact a second external electrode terminal, and a region to become a second internal electrically-conductive part of the probe, the regions being successively connected from a first end to a second end of the single metal plate, the housing part of the probe being to surround the first and second internal electrically-conductive parts of the probe.

14. The method as claimed in claim 13, wherein:
said bending includes
  first bending;
  second bending performed after said first bending; and
  third bending performed after said second bending,
said first bending bends the region to become the first internal electrically-conductive part and the region to become the second internal electrically-conductive part,
said second bending bends the region to become the first terminal contact part and the region to become the second terminal contact part substantially 180°, and
said third bending bends the region to become the first spring part and the region to become the second spring part.

15. The method as claimed in claim 13, wherein:
the first internal electrically-conductive part and the second internal electrically-conductive part of the probe are out of contact after said bending before installation of the probe in an insulating body outer frame, and
the first internal electrically-conductive part and the second internal electrically-conductive part of the probe are in contact with the probe being installed in the insulating body outer frame.

16. The method as claimed in claim 13, wherein said bending bends the region to become the housing part of the probe so that the housing part of the probe has a substantially square cross-sectional shape.

17. The method as claimed in claim 13, wherein the single metal plate has a thickness of 30 µm to 150 µm.

18. The method as claimed in claim 13, wherein said processing processes the single metal plate into the predetermined shape by performing press working on the single metal plate or etching off a region of the single metal plate other than a region of the single metal plate to have the predetermined shape.

* * * * *